(12) United States Patent
Schelling et al.

(10) Patent No.: US 11,733,068 B2
(45) Date of Patent: Aug. 22, 2023

(54) READOUT SIGNAL GENERATOR AND METHOD FOR OPERATING A CAPACITIVE DEVICE

(71) Applicant: Robert Bosch GmbH, Stuttgart (DE)

(72) Inventors: Christoph Schelling, Stuttgart (DE); Kerrin Doessel, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 269 days.

(21) Appl. No.: 17/287,027

(22) PCT Filed: Jan. 20, 2020

(86) PCT No.: PCT/EP2020/051258
§ 371 (c)(1),
(2) Date: Apr. 20, 2021

(87) PCT Pub. No.: WO2020/152091
PCT Pub. Date: Jul. 30, 2020

(65) Prior Publication Data
US 2021/0381850 A1  Dec. 9, 2021

(30) Foreign Application Priority Data

Jan. 25, 2019 (DE) .......................... 102019200923.9

(51) Int. Cl.
*G01D 5/24* (2006.01)
*G01D 3/036* (2006.01)
(Continued)

(52) U.S. Cl.
CPC ............... *G01D 5/24* (2013.01); *G01D 3/036* (2013.01); *G01R 27/2605* (2013.01); *G01L 9/12* (2013.01); *G01P 15/125* (2013.01)

(58) Field of Classification Search
CPC ........ G01R 27/00; G01R 27/02; G01R 27/26; G01R 27/2605; G01D 5/00; G01D 5/12;
(Continued)

(56) References Cited

U.S. PATENT DOCUMENTS 4,327,323 A * 4/1982 Walker ................. G01N 27/221
324/672
2016/0305835 A1 10/2016 Kollias et al.

FOREIGN PATENT DOCUMENTS

DE        60026031 T2    9/2006
DE   102016107299 A1   10/2016
(Continued)

OTHER PUBLICATIONS

International Search Report PCT/EP2020/051258, dated Apr. 22, 2020.

*Primary Examiner* — Hoai-An D. Nguyen
(74) *Attorney, Agent, or Firm* — Norton Rose Fulbright US LLP; Gerard Messina

(57) ABSTRACT

A method for operating a capacitive device. The method includes providing a pulsed readout signal having a pulse frequency at a readout signal channel, to which at least one capacitor unit of the capacitive device is electrically connected, and reading out the at least one capacitor unit of the capacitive device, which has a natural frequency with a natural frequency period duration $t_{res}$, using the pulsed readout signal. Each voltage pulse of the pulsed readout signal is applied to the readout signal channel in n temporally offset voltage stages, n being a natural number greater than or equal to 2, and a time offset $\Delta t_i$ is maintained between each two consecutively applied voltage stages in such a way that the following is true for at least one time offset $\Delta t_i$ between the voltage stages:

$$\Delta t_i = m * t_{res} + \frac{t_{res}}{n},$$

m being a natural number greater than or equal to zero.

9 Claims, 3 Drawing Sheets

(51) Int. Cl.
*G01R 27/26* (2006.01)
*G01L 9/12* (2006.01)
*G01P 15/125* (2006.01)

(58) Field of Classification Search
CPC .. G01D 5/14; G01D 5/24; G01D 3/00; G01D 3/028; G01D 3/036; G01L 9/00; G01L 9/12; G01P 15/00; G01P 15/02; G01P 15/08; G01P 15/125
USPC .................................. 324/600, 649, 658, 676
See application file for complete search history.

(56) References Cited

FOREIGN PATENT DOCUMENTS

EP    0520352 A2 * 12/1992   ......... G01R 27/2605
JP    S55150285 A    11/1980

* cited by examiner

READOUT SIGNAL GENERATOR AND METHOD FOR OPERATING A CAPACITIVE DEVICE

FIELD

The present invention relates to a readout signal generator for a capacitive device. The present invention likewise relates to a capacitive device. The present invention furthermore relates to a method for operating a capacitive device.

BACKGROUND INFORMATION

Signal generators are available in the related art for reading out a capacitive device, for example the excitation signal generator described in German Patent Application No. DE 10 2016 107 299 A1. FIG. 1 shows a diagram for explaining an operating mode of a signal generator for reading out a capacitive device according to the related art.

The conventional signal generator described below operates, by way of example, a capacitive measuring device including (only) one measuring capacitance, in that the signal generator reads out the capacitive measuring device with the aid of a pulsed voltage signal in a pulsed operation. In the diagram in FIG. 1, the abscissa is a time axis t, while a voltage intensity U of an (analog) response signal of the measuring capacitance of the capacitive measuring device operated in its pulsed mode is shown with the aid of the ordinate. Based on the diagram in FIG. 1, it is apparent that the pulsed voltage signal of the signal generator according to the related art generates a (transient) noise on the response signal of the measuring capacitance, in that the pulsed voltage signal excites at least one adjustable electrode component of the measuring capacitance to mechanical oscillations. The pulsed voltage signal of the conventional signal generator frequently excites a mechanical eigenmode of the measuring capacitance in an undesirable manner.

SUMMARY

The present invention provides a readout signal generator for a capacitive device, a capacitive device and a method for operating a capacitive device.

An example embodiment of the present invention provides possibilities for effectuating an (essentially) noise-free/transient noise-free, pulsed operation of a capacitive device, for example a capacitive sensor device or a microphone. The advantages of the pulsed operation of the capacitive device, such as, in particular, the low energy consumption of the capacitive device during its pulsed operation, may be used without a (transient) noise occurring on the particular measuring signal when reading out the capacitive device. The present invention thus contributes to energy savings, since potential users will more often choose capacitive devices operated in pulsed mode.

In one advantageous specific embodiment of the readout signal generator in accordance with the present invention, a maximal pulse intensity $V_{puls}$ is definable for each voltage pulse of the pulsed readout signal, the voltage signal generating unit being designed to apply the n voltage stages of the voltage pulse, each having an identical or different voltage stage level $\Delta V_i$, to the readout signal channel in such a way that the following is true:

$$V_{puls} = \sum_{i=1}^{n} \Delta V_i.$$

In particular, the voltage signal generating unit may be designed to apply the n voltage stages of the voltage pulse, each having the identical voltage stage level $\Delta V_i = V_{puls}/n$, to the readout signal channel. The application of the voltage signal to the readout signal channel in at least two substeps having the identical voltage stage level and a time offset $$\Delta t_i = m * t_{res} + \frac{t_{res}}{n}$$

counteracts an excitation of at least one capacitor unit of the capacitive device to the natural frequency having natural frequency period duration $t_{res}$ and therefore contributes to a lower-noise signal ascertainment.

In one advantageous specific embodiment of the readout signal generator in accordance with the present invention, the voltage signal generating unit is designed to reduce each voltage pulse of the pulsed readout signal in $n_e$ temporally offset voltage drop stages, $n_e$ being a natural number greater than or equal to 2, and a time offset $\Delta te_i$ existing between each of two consecutive voltage drop stages, and the following being true for the at least one time offset $\Delta te_i$ between the voltage drop stages:

$$\Delta te_i = m_e * t_{res} + \frac{t_{res}}{n_e},$$

$m_e$ being a natural number greater than or equal to zero. With the aid of the procedure described here, an excitation of the at least one capacitor unit of the capacitive device to the natural frequency having natural frequency period duration $t_{res}$ may be avoided even upon the removal/reduction of the maximum pulse intensity or the pulsed readout signal.

The voltage signal generating unit preferably includes n stages, which may be started up, temporally offset from each other, in such a way that each of the n stages applies one of the n voltage stages at a time of the voltage pulses of the pulsed readout signal to the readout signal channel. The voltage signal generating unit described here, which includes the n stages, may be manufactured comparatively cost-effectively and requires relatively little installation space. The specific embodiment of the voltage signal generating unit described here may thus be easily installed in or adjacent to a capacitive device.

Advantages of the above-described specific embodiments of the readout signal generator may be ensured even in a capacitive device including a readout signal generator of this type, and the at least one capacitor unit, which has a natural frequency with natural frequency period duration $t_{res}$, is electrically connected, directly or indirectly, to the readout signal channel and may be read out with the aid of the pulsed readout signal provided at the readout signal channel.

In one advantageous specific embodiment of the present invention, the capacitive device includes at least two capacitor units as its at least one capacitor unit, the at least two capacitor units each having a natural frequency with the same natural frequency period duration $t_{res}$. The same pulsed readout signal may thus be used for the noise-free/transient noise-free readout of at least two capacitor units of the capacitive device.

For example, the capacitive device may include at least one measuring capacitor unit and at least one reference capacitor unit as the at least two capacitor units. The present invention described here may thus also be used to carry out measurements, taking reference measurements into account.

The capacitive device is preferably a capacitive pressure sensor, a capacitive acceleration sensor, a capacitive rotation rate sensor or a microphone. However, it should be noted that the exemplary embodiments of the capacitive device described here should not be interpreted as final.

In addition, executing a corresponding method for operating a capacitive device in accordance with an example embodiment of the present invention also effectuates the advantages explained above. It should be noted that the method according to the specific embodiments of the readout signal generator and/or the capacitive device described above in accordance with the present invention may be refined.

BRIEF DESCRIPTION OF THE DRAWINGS

Further features and advantages of the present invention are explained below based on the figures.

DETAILED DESCRIPTION OF EXAMPLE EMBODIMENTS

Figure 1:
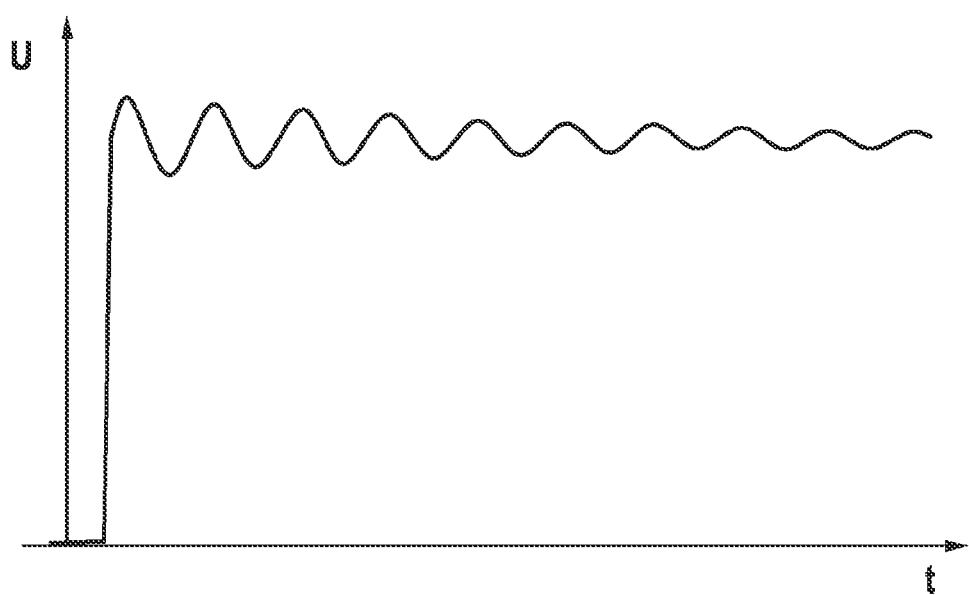
FIG. 1 shows a diagram for explaining an operating mode of a signal generator for reading out a capacitive device according to the related art.

FIGS. 2a through 2d show diagrams for explaining one specific embodiment of the method for operating a capacitive device.

The method described below may be used for any capacitive device which includes at least one capacitor unit. The at least one capacitor unit is understood to be an electrical unit made up of two electrode components, at least one of the two electrode components being deformable and/or adjustable in such a way that a capacitance present between the two electrode components is varied. The method is discussed below only as an example for a capacitive device whose at least one capacitor unit includes one diaphragm as an actuator electrode and one stationary stator electrode.

In the at least one capacitor unit of the capacitive device, at least one of its two electrode components has a mechanical oscillation which may be designated as a natural frequency with a natural frequency period duration $t_{res}$. In addition, such an operating state of the at least one capacitor unit is referred to as a natural frequency of the at least one capacitor unit having natural frequency period duration $t_{res}$. Natural frequency period duration $t_{res}$ may be understood to be, in particular, the natural frequency period duration of a fundamental mode of a natural frequency of the at least one capacitor unit of the capacitive device. Natural frequency period duration $t_{res}$ may thus be a reciprocal value of a frequency of the fundamental mode of a natural frequency of the at least one capacitor unit of the capacitive device.

In executing the example method described here, for the pulsed operation of the capacitive device, a pulsed readout signal having a pulse frequency is provided at a readout signal channel, to which the at least one capacitor unit of the capacitive device is directly or indirectly electrically connected. The pulse frequency of the pulsed readout signal may be a temporally constant pulse frequency during the pulse operation or the capacitive device or a temporally varying pulse frequency during the pulsed operation of the capacitive device. The pulsed readout signal is preferably understood to be a voltage signal having (nearly) rectangular pulse profiles. A pulse duration/pulse length $t_{puls}$ may be defined for each of the voltage pulses of the pulsed readout signal, the voltage pulses of the pulsed voltage signal being optionally able to have the same pulse duration $t_{puls}$ or different pulse durations $t_{puls}$ during the pulsed operation of the capacitive device.

The at least one capacitor unit of the capacitive device is read out with the aid of the pulsed readout signal. The pulsed readout signal is thus used only for reading out the at least one capacitor unit of the capacitive device, since the function principle/measuring principle of the at least one capacitor unit generally does not require a continuous current feed. However, the at least one capacitor unit is conventionally often set to a natural frequency having natural frequency period duration $t_{res}$ during its readout. An excitation of the at least one capacitor unit to the natural frequency having natural frequency period duration $t_{res}$ is, however, counteracted during an execution of the method described here, in that each voltage pulse of the pulsed readout signal is applied to the readout signal channel in n temporally offset voltage stages, n being a natural number greater than or equal to 2. In addition, a time offset $\Delta t_i$ is maintained between each of two consecutively applied voltage stages in such a way that the equation (Eq. 1) is true for the at least one time offset $\Delta t_i$ between the voltage stages:

$$\Delta t_i = m * t_{res} + \frac{t_{res}}{n}, \quad \text{(Eq. 1)}$$

m being a natural number greater than or equal to zero. The at least one time offset $\Delta t_i$ is thus in a value range between $\Delta t_{min} = t_{res}/n$ and $\Delta t_{max} = \Delta t_{min} + m\Delta t_i$, m preferably being selected in such a way that $\Delta t_{max}$ is significantly smaller than particular pulse duration $t_{puls}$. (Pulse duration $t_{puls}$ is the period of time between the concluded application of the n voltage stages to the readout signal channel and a later removal/reduction of the voltage applied to the readout signal channel.)

The n voltage stages each have a voltage stage level $\Delta V_i$, the equation (Eq. 2) being true for the sum of voltage stage levels $\Delta V_i$ of the n voltages:

$$V_{puls} = \sum_{i=1}^{n} \Delta V_i, \quad \text{(Eq. 2)}$$

$V_{puls}$ being the maximum pulse intensity of the voltage pulse finally applied to the readout channel.

A total application time $t_{total}$ of a voltage pulse of the pulsed readout signal to the readout signal channel is thus calculated according to equation (Eq. 3):

$$t_{total} = \sum_{i=1}^{n-1} \Delta t_i, \quad \text{(Eq. 3)}$$

During an application of the n voltage stages of a voltage pulse of the pulsed readout signal begun at a point in time $t_0$, the following is true according to equation (Eq. 4) for voltage V(t) instantaneously applied to the readout signal channel, where $t_0 < t < t_0 + t_{total}$:

$$V(t) = \sum_{i=1}^{j \leq n} \Delta V_i, \quad \text{(Eq. 4)}$$

j being the highest natural number less than or equal to n, for which the following is true:

$$t = t_0 + \sum_{i=1}^{j} \Delta t_i$$

The following is preferably true for a deviation δ from $\Delta t_i$: $|\delta| \ll t_{res}/2n^2$. The method described here has a particularly high robustness in this case.

Figure 2A:
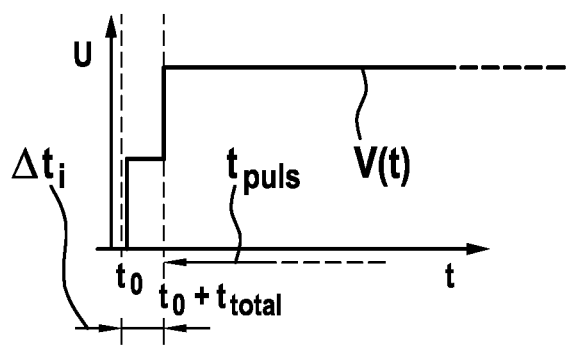
FIGS. 2a through 2d show diagrams for explaining one specific embodiment of the method for operating a capacitive device in accordance with the present invention.

In the diagram in FIG. 2a, the n-stage application of a voltage pulse of the pulsed readout signal is visually represented as an example of the two-stage application, m being equal to zero. In the diagram in FIG. 2a, the abscissa is a time axis t, while voltage V(t) applied to the readout signal channel is represented with the aid of the ordinate.

Figure 2B:
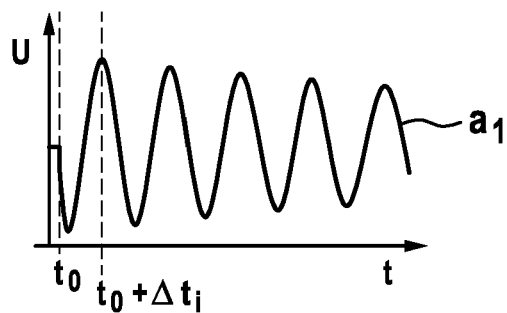
Figure 2C:
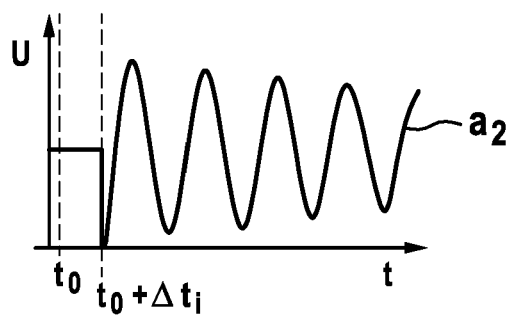

A first voltage stage is applied to the readout channel at a point in time $t_0$. The first voltage stage triggers a first acceleration $a_1$, which is visually represented with the aid of the ordinate of the diagram in FIG. 2b, of the diaphragm used in each case as an actuator electrode of the at least one capacitor unit of the capacitive device. (The abscissa of the diagram in FIG. 2b is a time axis t.) This may also be paraphrased as that the first voltage stage excites a natural frequency of the at least one capacitor unit of the capacitive device having natural frequency period duration $t_{res}$ at point in time $t_0$.

After time offset $\Delta t_i$ a second voltage stage is applied to the readout channel at point in time $t_0 + \Delta t_i$. The second voltage stage triggers a second acceleration $a_2$ of the diaphragm used in each case as an actuator electrode of the at least one capacitor unit, which is visually represented by the ordinate of the diagram in FIG. 2c. (The abscissa of the diagram in FIG. 2c is again a time axis t.)

For example, an "ideal" time offset $t_{res}/2$ of one half of natural frequency period duration $t_{res}$ exists between times $t_0$ and $t_0 + \Delta t_i$. Second acceleration $a_2$ therefore counteracts first acceleration $a_1$ in phase opposition. Starting at point in time $t_0 + \Delta t_i$, second voltage stage thus effectuates a "damping" of the natural frequency of the at least one capacitor unit of the capacitive device having natural frequency period duration $t_{res}$, which is excited with the aid of the first voltage stage at point in time $t_0$.

Figure 2D:
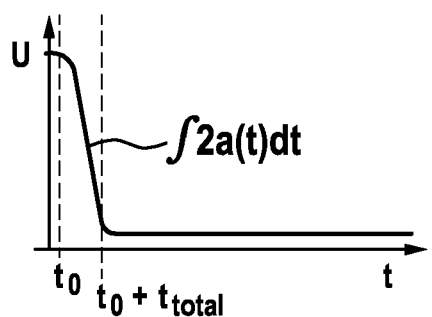

In the diagram in FIG. 2d, the abscissa is a time axis t, while an integral $\int 2a(t)dt$ over an acceleration a(t) of the diaphragm used in each case as an actuator electrode of the at least one capacitor unit from its particular idle position, starting at time $t_0$, is represented with the aid of the ordinate. Based on the diagram in FIG. 2d, it is apparent that the particular diaphragm of the at least one capacitor unit remains (essentially) immobile starting at time $t_0 + \Delta t_i$.

The principle of the "damping" described in the two preceding paragraphs takes effect accordingly even in the case of a three-stage or multistage application of the particular voltage pulse of the pulsed readout signal. Even in the case of an application of the particular voltage pulse with the aid of at least three consecutively applied voltage stages, e.g. the diaphragm used as an actuator electrode of the at least one capacitor unit of the capacitive device remains (essentially) immobile starting at total application time $t_{total}$ (or earlier). The advantageous "damping" is present after a relatively short decay time, which is (almost) equal to total application time $t_{total}$. The shortness of the decay time reduces a noise of the capacitive device operated with the aid of the pulsed readout signal in a pulsed operation.

The n voltage stages of the particular voltage pulse preferably have the same voltage stage level $\Delta V_i = V_{puls}/n$. A procedure of the type upon the application of the n voltage stages of the particular voltage pulse effectuates a particularly advantageous "damping" of the natural frequency of the at least one capacitor unit of the capacitive device having natural frequency period duration $t_{res}$.

In the case of a three-stage or multistage application of the particular voltage pulse of the pulsed readout signal, the n voltage stages are also distributed preferably equidistantly within total application time $t_{total}$ of the particular voltage pulse of the pulsed readout signal. The equal distribution of the n voltage stages additionally improves the advantageous "damping" of the natural frequency of the at least one capacitor unit of the capacitive device having natural frequency period duration $t_{res}$. In particular, in the case of a three-stage or multistage application of the particular voltage pulse of the pulsed readout signal, the following are true for all of the at least two time offsets $\Delta t_i$ between the voltage stages: $\Delta t_i = t_{total}/(n-1)$ The "damping" of the natural frequency of the at least one capacitor unit of the capacitive device having natural frequency period duration $t_{res}$, which may be effectuated with the aid of the method described here, prevents an occurrence of a noise/transient noise on an electrical response signal read out from the at least one capacitor unit of the capacitive device. Executing the method described here thus makes it easier to evaluate the response signal of the capacitive device. In addition, the freedom from noise/freedom from transient noise of the response signal obtained during an execution of the method described here contributes to improving an accuracy and/or to reducing an error risk during an establishment of at least one measured value based on the response signal. The readout signal is preferably detected only after the application of all n voltage stages, i.e., after total application time $t_{total}$ of the particular voltage pulse of the pulsed readout signal.

The later removal/reduction of the voltage of the particular voltage pulse of the pulsed readout signal applied to the readout signal channel may take place in $n_e$ temporally offset voltage drop stages, $n_e$ being a natural number greater than or equal to 2. In addition, a time offset $\Delta t e_i$ may be maintained between each of two consecutively carried out voltage stages in such a way that equation (Eq. 5) is true for the at least one time offset $\Delta t e_i$ between the voltage drop stages:

$$\Delta t e_i = m_e * t_{res} + \frac{t_{res}}{n_e}, \quad \text{(Eq. 5)}$$

$m_e$ being a natural number greater than or equal to zero. The $n_e$ voltage drop stages may each have a voltage drop stage level $\Delta V e_i$, equation (Eq. 6) being true for the sum of voltage drop stage levels $\Delta V e_i$ of the $n_e$ voltage drop stages:

$$V_{puls} = \sum_{i=1}^{n} \Delta V e_i \quad \text{(Eq. 6)}$$

The $n_e$ voltage drop stages each preferably have the same voltage drop stage level $\Delta Ve_i = V_{puls}/n$. A total cutoff time $te_{total}$ of the particular voltage pulse of the pulsed readout signal on the readout signal channel is thus calculated according to equation (Eq. 7):

$$te_{total} = \sum_{i=1}^{n-1} \Delta te_i \quad (Eq. 7)$$

In a three-stage or multistage removal/reduction of the voltage of the particular voltage pulse of the pulsed readout signal applied to the readout signal channel, the $n_e$ voltage drop stages are preferably distributed equidistantly within total cutoff time $te_{total}$ of the particular voltage pulse. In particular, the following may be true: $\Delta te_i = t_{total}/(n_e-1)$ If the removal/reduction of the particular voltage pulse of the pulsed readout signal is begun at a point in time $te_0$, the following applies to voltage V(t) instantaneously applied to the readout signal channel, where $te_0 < t < te_0 + te_{total}$ according to equation (Eq. 8):

$$V(t) = V_{puls} - \sum_{i=1}^{j<n} \Delta Ve_i \quad (Eq. 8)$$

j being the highest natural number less than or equal to $n_e$, for which the following is true:

$$t = te_0 + \sum_{i=1}^{j} \Delta te_i$$

Here as well, the procedure described here for the removal/reduction of the particular voltage pulse of the pulsed readout signal effectuates a particularly advantageous "damping" of the natural frequency of the at least one capacitor unit of the capacitive device having natural frequency period duration $t_{res}$.

Figure 3A:
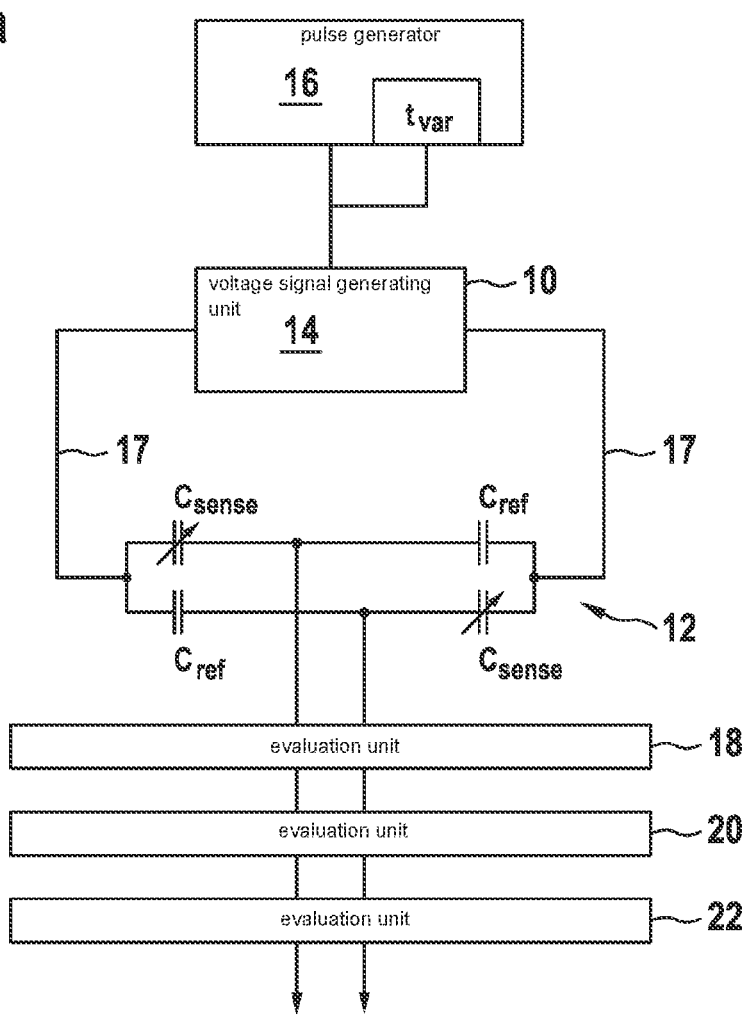
FIGS. 3a and 3b show schematic partial and complete representations of one specific embodiment of the readout signal generator or the capacitive device interacting therewith, in accordance with the present invention.
Figure 3B:
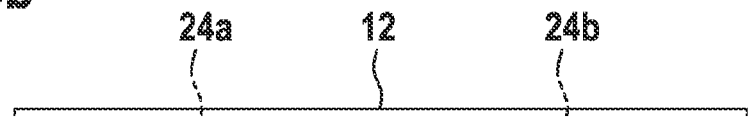

FIGS. 3a and 3b show schematic partial and complete representations of one specific embodiment of the readout signal generator or the capacitive device interacting therewith.

Readout signal generator 10 illustrated in FIG. 3a may also be referred to as an excitation signal generator of capacitive device 12. Readout signal generator 10 may be part of capacitive device 12. However, readout signal generator 10 may also be mounted separately from capacitive device 12 interacting therewith.

Readout signal generator 10 includes at least one voltage signal generating unit 14, which is controllable with the aid of a pulse generator 16. Pulse generator 16 may be a pulse generator 16 specific to the readout signal generator or external to the readout signal generator. Voltage signal generating unit 14 is controllable with the aid of pulse generator 16 in such a way that voltage signal generating unit 14 provides a pulsed readout signal having a pulse frequency $t_{var}$ predefined by pulse generator 16 at a readout signal channel 17 of readout signal generator 10. At least one capacitor unit $C_{sense}$ and $C_{ref}$ of capacitive device 12, which is directly or indirectly electrically connected to readout signal channel 17, may be read out with the aid of the pulsed readout signal. However, the at least one capacitor unit $C_{sense}$ and $C_{ref}$ also has a natural frequency with a natural frequency period duration $t_{res}$. Natural frequency period duration $t_{res}$ may be understood to be, in particular, the natural frequency period duration of a fundamental mode of a natural frequency of the at least one capacitor unit $C_{sense}$ and $C_{ref}$.

Voltage signal generating unit 14 is designed to apply each voltage pulse of the pulsed readout signal to readout signal channel 17 in n temporally offset voltage stages, n being a natural number greater than or equal to 2. In addition, voltage signal generating unit 14 is designed to maintain a time offset $\Delta t_i$ between two consecutively applied voltage stages, the equation (Eq. 1) already cited above being true for the at least one time offset $\Delta t_i$ between the voltage stages.

$$\Delta t_i = m * t_{res} + \frac{t_{res}}{n}, \quad (Eq. 1)$$

m being a natural number greater than or equal to zero.

Readout signal transmitter 10 described here thus also effectuates a "damping" of the natural frequency of the at least one capacitor unit $C_{sense}$ and $C_{ref}$ of capacitive device 12 having natural frequency period duration $t_{res}$. A response signal read out from the at least one capacitor unit $C_{sense}$ and $C_{ref}$ is also therefore much less noisy compared to the related art. Due to the use of readout signal generator 10 described here, capacitive device 12 supplies a particularly low-noise response signal. Further measures for suppressing the transient noise of the response signal do not need to be taken when using readout signal generator 10. Since the use of readout signal generator 10 permits a low-noise signal ascertainment, cost-effective evaluation units 18 through 22 which require little installation space may be used to evaluate the response signal of capacitive device 12 ascertained in each case.

Voltage signal generating unit 14 may also be provided with a cost-effective design requiring little installation space. For example, voltage signal generating unit 14 may include n stages, which may be started up, temporally offset from each other, in such a way that each of the n stages applies one of the n voltage stages at a time of the voltage pulses of the pulsed readout signal to the readout signal channel 17.

A maximum pulse intensity $V_{puls}$ may generally be defined for each voltage pulse of the pulsed readout signal, voltage signal generating unit 14 being designed to apply the n voltage stages of the voltage pulse having a same or different voltage stage level $\Delta V_i$ to readout signal channel 17 in such a way that equation (Eq. 2) already discussed above is true:

$$V_{puls} = \sum_{i=1}^{n} \Delta V_i, \quad (Eq. 2)$$

Voltage signal generating unit 14 is preferably designed to apply the n voltage stages of the voltage pulse, each having the same voltage stage level $\Delta V_i = V_{puls}/n$, to readout signal channel 17. The procedure described here additionally contributes to the "damping" of the natural frequency of the at least one capacitor unit $C_{sense}$ and $C_{ref}$ of capacitive device 12 having natural frequency period duration $t_{res}$.

Capacitive device 12 may include at least two capacitor units $C_{sense}$ and $C_{ref}$ as its at least one capacitor unit $C_{sense}$ and $C_{ref}$. The at least two capacitor units $C_{sense}$ and $C_{ref}$ preferably have a natural frequency with the same natural frequency period duration $t_{res}$. The at least two capacitor units $C_{sense}$ and $C_{ref}$ may also be connected to each other in the form of Wheatstone bridges 24a and 24b (cf. FIG. 3b). In addition, the at least two capacitor units $C_{sense}$ and $C_{ref}$ may be at least one measuring capacitor unit $C_{sense}$ and at least one reference capacitor unit $C_{ref}$. In the case of the at least one measuring capacitor unit $C_{sense}$, at least one of its two electrode components is deformable and/or adjustable as a response to a measured variable to be determined with the aid of particular measuring capacitor unit $C_{sense}$ in such a way that a capacitance present between the two electrode components of measuring capacitor unit $C_{sense}$ is varied. In contrast, in the case of the at least one reference capacitor unit $C_{ref}$, a deformation or adjustment of its two electrode components as a response to the particular measured variable is (essentially) prevented.

Capacitive device 12 may be a capacitive pressure sensor, a capacitive acceleration sensor, a capacitive rotation rate sensor or a microphone. In the specific embodiment in FIGS. 3a and 3b, capacitive device 12 is a capacitive pressure sensor only as an example, which includes two Wheatstone bridges 24a and 24b, each of the two Wheatstone bridges 24a and 24b including two measuring capacitor units $C_{sense}$ and two reference capacitor units $C_{ref}$. (As a refinement, a large number of parallel-connected capacitor units $C_{sense}$ and $C_{ref}$ may also be integrated into the two Wheatstone bridges 24a and 24b for each of capacitor units $C_{sense}$ and $C_{ref}$ illustrated in FIG. 3b.) Measuring capacitor units $C_{sense}$ each include a diaphragm used as an actuator electrode, which may bulge into a reference pressure cavity and/or bulge out of the reference pressure cavity due to a pressure prevailing at its outer surface, a counter-electrode being situated in each reference pressure cavity of measuring capacitor units $C_{sense}$ in such a way that a pressure-dependent capacitance is present between each diaphragm of measuring capacitor unit $C_{sense}$ and the counter-electrode assigned thereto. In contrast, reference capacitor units $C_{ref}$ are designed as "fixed capacitances" in such a way that a capacitance present between their diaphragm and the assigned counter-electrode is (essentially) pressure-independent.

During the readout of the two Wheatstone bridges 24a and 24b with the aid of readout signal generator 10, the signals of the two Wheatstone bridges 24a and 24b may be summed up to a response signal. A signal amplifier 18 may amplify the response signal. The amplified response signal may then be converted into a digital signal with the aid of an ADC converter 20. A filter 22 may then average the digital signal over multiple pulses.

As an advantageous refinement of the present invention, voltage signal generating unit 14 may also be designed to reduce each voltage pulse of the pulsed readout signal in $n_e$ temporally offset voltage drop stages, $n_e$ being a natural number greater than or equal to 2, and a time offset $\Delta te_i$ being present in each case between two consecutively carried out voltage drop stages, and the aforementioned equation (Eq. 5) being true in each case to the at least one time offset $\Delta te_i$ between the voltage drop stages:

$$\Delta te_i = m_e * t_{res} + \frac{t_{res}}{n_e}, \quad \text{(Eq. 5)}$$

$m_e$ being a natural number greater than or equal to zero. The advantageous "damping" of the natural frequency of the at least one capacitor unit $C_{sense}$ and $C_{ref}$ of capacitive device 12 having natural frequency period duration $t_{res}$ may thus also be effectuated in the case of the removal/reduction of the particular voltage pulse of the pulsed readout signal.

Readout signal generator 10/its voltage signal generating unit 14 may also be designed to carry out further of the method steps described above. A repeated description of these method steps is omitted here.

What is claimed is:

1. A readout signal generator for a capacitive device, comprising:
   a voltage signal generating unit, which is controlled using a pulse generator specific to the readout signal generator or external to the readout signal generator so that the voltage signal generating unit provides a pulsed readout signal having a pulse frequency predefined by the pulse generator at a readout signal channel of the readout signal generator so that the capacitive device, which is electrically connected to the readout signal channel and which has a natural frequency with a natural frequency period duration $t_{res}$, is read out using the pulsed readout signal; and
   a plurality of evaluation units;
   wherein the voltage signal generating unit is configured to apply each voltage pulse of the pulsed readout signal to the readout signal channel in n temporally offset voltage stages, n being a natural number greater than or equal to 2, and a time offset $\Delta t_i$ existing in each case between two consecutively applied voltage stages, and the following being true for the at least one time offset $\Delta t_i$ between the voltage stages:

$$\Delta t_i = m * t_{res} + \frac{t_{res}}{n},$$

m being a natural number greater than or equal to zero,
   wherein the capacitive device includes at least a first capacitor unit and a second capacitor unit arranged in parallel, wherein the first capacitive unit includes a first sense capacitor in series with a first reference capacitor, wherein the second capacitive unit includes a second sense capacitor in series with a second reference capacitor, wherein a series order of the first sense capacitor and the first reference capacitor is reversed with respect to a series order of the second sense capacitor and the second reference capacitor,
   wherein the first capacitor unit has a first tap line between the first sense capacitor and the first reference capacitor, wherein the second capacitor unit has a second tap line between the second sense capacitor and the second reference capacitor,
   wherein the tap lines are connected to each of the plurality of evaluation units, and
   wherein the capacitive device is connected by two readout signal channels to the voltage signal generating unit.

2. The readout signal generator as recited in claim 1, wherein a maximum pulse intensity $V_{puls}$ is definable for each voltage pulse of the pulsed readout signal, the voltage signal generating unit being configured to apply the n voltage stages of the voltage pulse having a same or different voltage stage level $\Delta V_i$ to the readout signal channel so that the following is true:

$$V_{puls} = \sum_{i=1}^{n} \Delta V_i$$

3. The readout signal generator as recited in claim 2, wherein the voltage signal generating unit is configured to apply the n voltage stages of the voltage pulse, each having the same voltage stage level $\Delta V_i = V_{puls}/n$, to the readout signal channel.

4. The readout signal generator as recited in claim 1, wherein the voltage signal generating unit is configured to reduce each voltage pulse of the pulsed readout signal in $n_e$ temporally offset voltage drop stages, $n_e$ being a natural number greater than or equal to 2, and a time offset $\Delta te_i$ being present in each case between two consecutively carried out voltage drop stages, and the following being true for the at least one time offset $\Delta te_i$ between the voltage drop stages:

$$\Delta te_i = m_e * t_{res} + \frac{t_{res}}{n_e},$$

$m_e$ being a natural number greater than or equal to zero.

5. The readout signal generator as recited in claim 1, wherein the voltage signal generating unit includes n stages, which are started up, temporally offset from each other, so that each of the n stages applies one of the n voltage stages at a time of the voltage pulses of the pulsed readout signal to the readout signal channel.

6. A capacitive device, comprising:
   a readout signal generator for a capacitive device, including:
      a voltage signal generating unit, which is controlled using a pulse generator specific to the readout signal generator or external to the readout signal generator so that the voltage signal generating unit provides a pulsed readout signal having a pulse frequency predefined by the pulse generator at a readout signal channel of the readout signal generator so that the capacitive device, which is electrically connected to the readout signal channel and which has a natural frequency with a natural frequency period duration $t_{res}$, is read out using the pulsed readout signal; and
      a plurality of evaluation units;
   wherein the voltage signal generating unit is configured to apply each voltage pulse of the pulsed readout signal to the readout signal channel in n temporally offset voltage stages, n being a natural number greater than or equal to 2, and a time offset $\Delta t_i$ existing in each case between two consecutively applied voltage stages, and the following being true for the at least one time offset $\Delta t_i$ between the voltage stages:

$$\Delta t_i = m * t_{res} + \frac{t_{res}}{n},$$

m being a natural number greater than or equal to zero,
   wherein the capacitive device includes at least a first capacitor unit and a second capacitor unit arranged in parallel, wherein the first capacitor unit includes a first sense capacitor in series with a first reference capacitor, wherein the second capacitive unit includes a second sense capacitor in series with a second reference capacitor, wherein a series order of the first sense capacitor and the first reference capacitor is reversed with respect to a series order of the second sense capacitor and the second reference capacitor,
   wherein the first capacitor unit has a first tap line between the first sense capacitor and the first reference capacitor, wherein the second capacitor unit has a second tap line between the second sense capacitor and the second reference capacitor,
   wherein the tap lines are connected to each of the plurality of evaluation units,
   wherein the capacitive device is connected by two readout signal channels to the voltage signal generating unit, and
   wherein the capacitive device, which has a natural frequency with the natural frequency period duration $t_{res}$, is electrically connected to the readout signal channel and is read out using the pulsed readout signal provided at the readout signal channel.

7. The capacitive device as recited in claim 6, wherein the capacitor units each have a natural frequency with the same natural frequency period duration $t_{res}$.

8. The capacitive device as recited in claim 6, wherein the capacitive device is a capacitive pressure sensor, or a capacitive acceleration sensor, or a capacitive rotation rate sensor, or a microphone.

9. A method for operating a capacitive device, the method comprising:
   providing a pulsed readout signal having a pulse frequency at a readout signal channel, to which the capacitive device is electrically connected; and
   reading out the capacitive device, which has a natural frequency with a natural frequency period duration $t_{res}$, using the pulsed readout signal;
   wherein each voltage pulse of the pulsed readout signal is applied to the readout signal channel in n temporally offset voltage stages, n being a natural number greater than or equal to 2,
   wherein a time offset $\Delta t_i$ is maintained in each case between two consecutively applied voltage stages so that the following is true for the at least one time offset $\Delta t_i$ between the voltage stages:

$$\Delta t_i = m * t_{res} + \frac{t_{res}}{n},$$

m being a natural number greater than or equal to zero,
   wherein the capacitive device includes at least a first capacitor unit and a second capacitor unit arranged in parallel, wherein the first capacitive unit includes a first sense capacitor in series with a first reference capacitor, wherein the second capacitive unit includes a second sense capacitor in series with a second reference capacitor, wherein a series order of the first sense capacitor and the first reference capacitor is reversed with respect to a series order of the second sense capacitor and the second reference capacitor,
   wherein the first capacitor unit has a first tap line between the first sense capacitor and the first reference capacitor, wherein the second capacitor unit has a second tap line between the second sense capacitor and the second reference capacitor, wherein the tap lines are connected to each of the plurality of evaluation units, and wherein the capacitive device is connected by two readout signal channels to the voltage signal generating unit.

* * * * *